(12) United States Patent
Rodgers

(10) Patent No.: US 6,808,275 B2
(45) Date of Patent: Oct. 26, 2004

(54) MIRROR ASSEMBLY WITH ELEVATOR LIFTER

(75) Inventor: Murray Steven Rodgers, Albuquerque, NM (US)

(73) Assignee: MEMX, Inc., Albuquerque, NM (US)

( * ) Notice: Subject to any disclaimer, the term of this patent is extended or adjusted under 35 U.S.C. 154(b) by 0 days.

(21) Appl. No.: 10/682,679

(22) Filed: Oct. 9, 2003

(65) Prior Publication Data

US 2004/0070858 A1 Apr. 15, 2004

Related U.S. Application Data

(62) Division of application No. 10/099,466, filed on Mar. 14, 2002, now Pat. No. 6,637,901.

(51) Int. Cl.[7] ................................................. G02B 5/08
(52) U.S. Cl. ........................ 359/848; 359/871; 359/872
(58) Field of Search ........................ 359/848, 871–872, 359/877, 224–226

(56) References Cited

U.S. PATENT DOCUMENTS

| | | | |
|---|---|---|---|
| 6,253,001 B1 | 6/2001 | Hoen | 385/17 |
| 6,283,601 B1 | 9/2001 | Hagelin et al. | 359/871 |
| 2001/0048265 A1 | 12/2001 | Miller et al. | 310/309 |

Primary Examiner—Mohammad Sikder
(74) Attorney, Agent, or Firm—Marsh Fischmann & Breyfogle LLP

(57) ABSTRACT

The present invention is generally directed to a method and assembly for elevating and supporting a microstructure of a MEM system generally by engaging a positioning system of the MEM system with a first elevator lifter. The MEM system generally includes a first microstructure (such as a mirror) disposed in vertically spaced relation to a substrate. The positioning system generally includes an actuator assembly movably interconnected with the substrate, an elevator pivotally interconnected with the substrate and further interconnected with the microstructure, and a tether interconnecting the actuator assembly and the elevator. The first elevator lifter is provided to engage the elevator to lift/elevate the microstructure away from the substrate generally after fabrication of the MEM system and prior to utilizing the microstructure in operation of the MEM system.

15 Claims, 11 Drawing Sheets

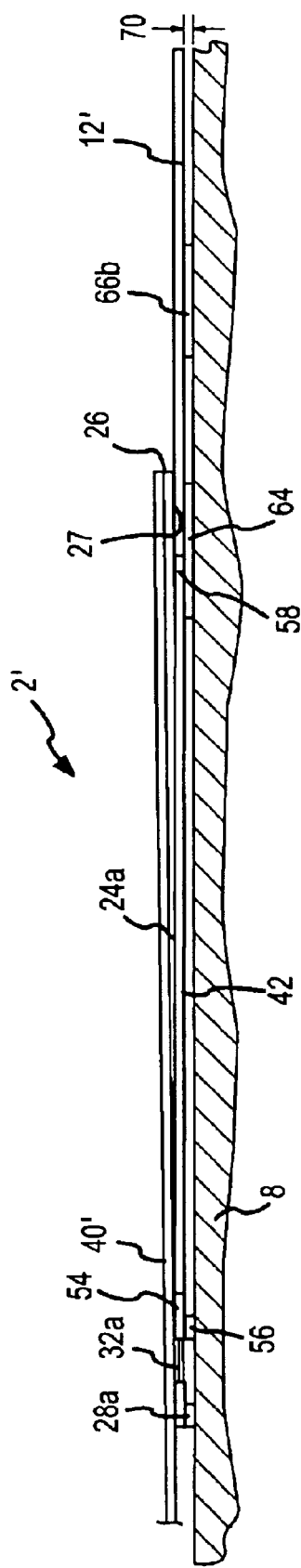

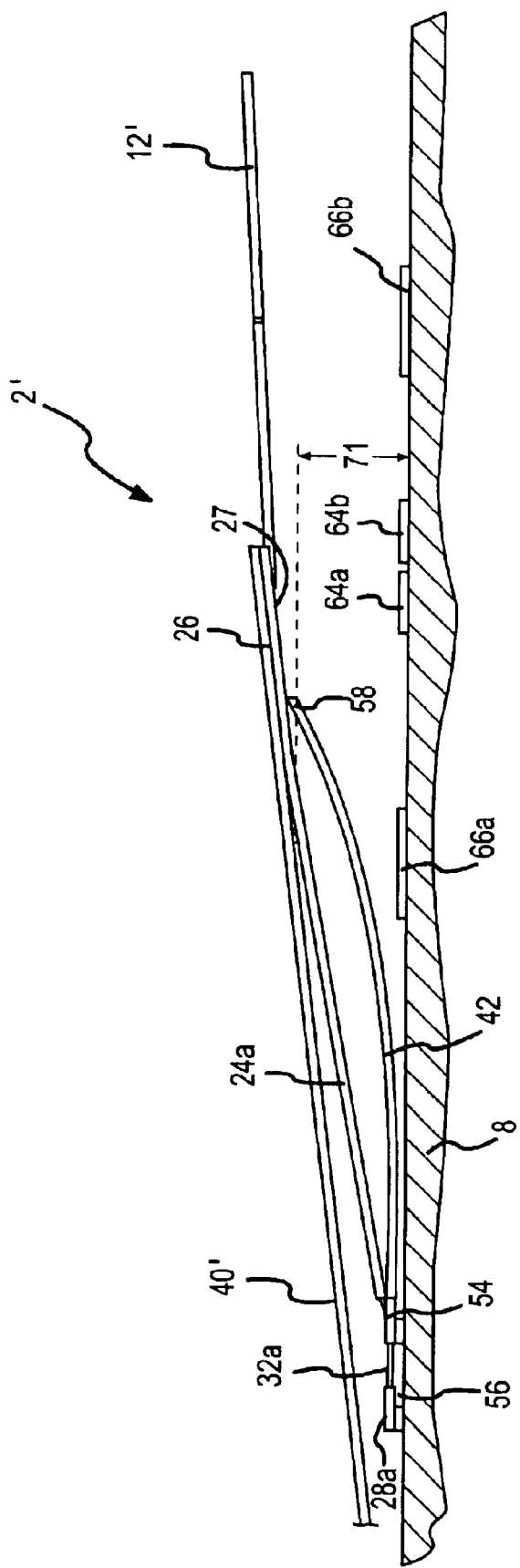

MIRROR ASSEMBLY WITH ELEVATOR LIFTER

CROSS-REFERENCE TO RELATED APPLICATIONS

This patent application is a divisional of, and claims priority under 35 U.S.C. §120 to, U.S. patent application Ser. No. 10/099,466, that is entitled "MIRROR ASSEMBLY WITH ELEVATOR LIFTER," and that was filed on Mar. 14, 2002, now U.S. Pat. No. 6,637,901 the entire disclosure of which is incorporated by reference in its entirety herein.

FIELD OF THE INVENTION

The present invention generally relates to microelectromechanical systems and, more particularly to an enhanced way of moving a microstructure away from a substrate to what may be characterized as a neutral position.

BACKGROUND OF THE INVENTION

There are a number of microfabrication technologies that have been utilized for making microstructures (e.g., micromechanical devices, microelectromechanical devices) by what may be characterized as micromachining, including LIGA (Lithography, Galvonoforming, Abforming), SLIGA (sacrificial LIGA), bulk micromachining, surface micromachining, micro electrodischarge machining (EDM), laser micromachining, 3-D stereolithography, and other techniques. Bulk micromachining has been utilized for making relatively simple micromechanical structures. Bulk micromachining generally entails cutting or machining a bulk substrate using an appropriate etchant (e.g., using liquid crystal-plane selective etchants; using deep reactive ion etching techniques). Another micromachining technique that allows for the formation of significantly more complex microstructures is surface micromachining. Surface micromachining generally entails depositing alternate layers of a structural material (e.g., polysilicon) and a sacrificial material (e.g., silicon dioxide) using an appropriate substrate (e.g., a silicon wafer) that functions as the foundation for the resulting microstructure(s). Various patterning operations (collectively including masking, etching, and mask removal operations) may be executed on one or more of these layers before the next layer is deposited so as to define the desired microstructure(s) from the structural material in one or more of the structural layers. After the microstructure(s) has been defined in this general manner, the various sacrificial layers are removed by exposing the microstructure(s) and the various sacrificial layers to one or more etchants. This is commonly called "releasing" the microstructure(s) from the substrate, typically to allow at least some degree of relative movement between at least some of the microstructures and the substrate.

Surface micromachining may be used to fabricate a mirror array that is defined by a plurality of mirror assemblies. Each mirror assembly may generally include a mirror and a mirror positioning assembly. Typically each mirror would be fabricated at a structural level in a surface micromachined system that is vertically spaced from a substrate that is used in the fabrication of the microelectromechanical system. It may be desirable to move each of these mirrors from their corresponding fabricated position (e.g., the position occupied by the mirrors in the microelectromechanical system prior to using an appropriate release etchant to remove the various layers of sacrificial material) to a position that is spaced further from the substrate prior to operating each of the various mirror assemblies. That is, it may be desirable to increase the spacing of each of the various mirrors from the substrate prior to tilting each of the various mirrors in a desired manner to provide the desired optical function.

SUMMARY OF THE INVENTION

The present invention is generally directed to microelectromechanical (MEM) systems, and more specifically, to an assembly for elevating and supporting a microstructure (e.g. a reflective microstructure/mirror) of a MEM system generally by engaging a positioning system of the MEM system with an elevator lifter. The assembly of the present invention desirably addresses a need to increase the vertical spacing between various microstructures and the substrate (generally after fabrication of the MEM system and prior to utilizing each of the various microstructures in operations of the MEM system) to allow for larger tilt angles and/or greater movement of the microstructures while preventing contact between the substrate and the microstructures. Another benefit of the present invention may be to avoid potential stiction-related problems between the mirror(s) and the substrate. Yet another benefit of increasing the spacing of the mirror(s) may be to reduce the potential for improper operation of the associated positioning assembly by pre-elevating it above a difficult-to-operate-in 0 degree horizontal position. While particularly desirable applications of the assembly may be in elevating and supporting reflective microstructures such as mirrors of an optical array/switch, the assembly of the present invention may be utilized in any appropriate microelectromechanical application for which elevation/lifting of a microstructure is desired/required.

A first aspect of the present invention relates to a microelectromechanical (MEM) system formed on a substrate. This MEM system generally includes a first microstructure (such as a mirror) disposed in vertically spaced relation to the substrate. In other words, this first microstructure is positioned above and preferably avoids direct contact with the substrate. In addition, the MEM system also includes an actuator assembly movably interconnected with the substrate. An elevator is generally pivotally interconnected with the substrate and further interconnected with the microstructure. This elevator is typically interconnected with the actuator assembly via a tether. In addition, this MEM system generally includes a first elevator lifter engageable with the elevator. By designing the first elevator lifter to engage the elevator (e.g., rather than the microstructure itself), this first aspect reduces the potential of subsequent operation of the microstructure being hindered due to inadvertent malpositioning of the microstructure between a portion of the elevator lifter and the substrate (i.e., reduces the potential for the microstructure to get caught under a portion of the elevator lifter).

Various refinements exist of the features noted in relation to the first aspect of the present invention. Further features may also be incorporated in this first aspect as well. These refinements and additional features may exist individually or in any combination. For example, this first aspect may utilize any appropriate number and/or type of actuator(s). In addition, any appropriate configuration of the tether and elevator may be utilized which provides for a pivotal interconnection of the elevator to the substrate as well as pivotal movement of the elevator with respect to the substrate. Herein, a "pivotal interconnection" or the like, refers to any type of interconnection that allows a microstructure to at least generally undergo a pivoting or pivotal-like motion when exposed to an appropriate force, including without limitation any interconnection that allows a microstructure or a portion thereof to move at least generally about a certain axis. Representative pivotal interconnections include the use of a flexing or elastic deformation of a microstructure or a portion thereof, as well as the use of relative motion between two or more microstructures that are typically in interfacing relation during at least a portion of the relative movement (e.g., a hinge connection; a ball and socket connection).

Some variations of this subject first aspect may also include a displacement multiplier having an input structure and an output structure. In such variations, the actuator assembly may be interconnected with the input structure and the tether may be interconnected with the output structure. Thus, movement/actuation of one or more actuator elements (such as a moveable electrostatic comb) of the actuator assembly may be magnified to provide a motive force to move/displace the tether (and generally the structure(s) attached thereto).

The first elevator lifter of the MEM system of the first aspect may be at least initially disposed in vertically spaced relation to the elevator. Thus, in some variations, the first elevator lifter may be positioned under at least a portion of the elevator. Stated another way, the first elevator lifter may be interposed between the substrate and at least a portion of the elevator. This first elevator lifter may include one or more pre-stressed beams. The pre-stressed beam(s) of the first elevator lifter may be made up of an encased oxide (e.g., doped/undoped silicon dioxide or silicon oxide) or any other appropriate material(s). In some variations, the pre-stressed beam(s) may include upper and lower walls disposed in vertically spaced relation by a closed-perimeter sidewall that extends between and interconnects the upper and lower walls. In such variations having a sidewall and upper and lower walls, the oxide may be positioned within an enclosed space defined by the upper and lower walls and the sidewall. A thickness of the oxide positioned between the upper and lower walls of the pre-stressed beam(s) can generally be within a range of about 0.3 microns to about 6 microns, and more preferably about 3.5 microns. However, thicknesses outside the disclosed range may be appropriate.

Some variations of the subject first aspect may include a first fuse interconnected with the first elevator lifter. In such variations, the first fuse generally functions to maintain the first elevator lifter in a fixed, vertically spaced position relative to at least a portion of the elevator prior to being activated. In other words, the first fuse may function to maintain a distance of separation between the first elevator lifter and the elevator before the fuse is "blown". After activation of this first fuse (i.e., after an threshold amount of voltage is applied to the fuse, causing the fuse to break), the first elevator lifter may engage at least a portion of the elevator to move and/or tilt the elevator at least generally away from the substrate. In some variations, a plurality of fuses (e.g., first and second fuses) may be utilized to hold the positioning of the first elevator lifter prior to activation of the fuses.

In some variations of the first aspect, sacrificial material may maintain the first elevator lifter in vertically spaced relation to at least a portion of the elevator prior to being released by an etchant. After release of the sacrificial material, the first elevator lifter engages at least a portion of the elevator to move the elevator at least generally away from the substrate. In other words, during an appropriate fabrication process, the first elevator lifter may be held in place (i.e., kept away from significantly biasing the elevator) by an appropriate sacrificial material, such as an oxide. When this sacrificial material is etched away during a "release" step of the fabrication process, nothing remains to prevent the first elevator lifter from engaging and exerting a lifting force on at least a portion of the elevator.

First and second interconnects may extend between and interconnect the elevator with the microstructure in the case of the first aspect. These first and second interconnects may have a variety of designs/configurations. In addition, the first and second interconnects may exhibit a variety of tensile and/or elastic properties. However, these first and second interconnects preferably exhibit some compliance/flexibility. Those various features discussed above in relation to the first aspect of the present invention may be incorporated into any of the other aspects of the present invention as well, and in any appropriate manner noted herein.

A second aspect of the present invention is embodied in a method for controlling a position of a microstructure (such as a mirror) relative to a substrate. The method generally includes exerting an at least substantially upwardly-directed force directly on an elevator to move at least a portion of the elevator at least generally away from the substrate. Typically, the microstructure is interconnected with at least a portion of the elevator. Due to the exertion of the at least substantially upwardly-directed force, the microstructure is generally moved from a first position to a second position. In other words, since the microstructure is interconnected with the elevator, exertion of an upwardly-directed (i.e., oriented at least generally away from the substrate) force on the elevator tends to cause the microstructure to move from a first position to a second position.

Various refinements exist of the features noted in relation to the second aspect of the present invention. Further features may also be incorporated in this second aspect as well. These refinements and additional features may exist individually or in any combination. The exerting step may include exerting a passive force on the elevator. A "passive force" herein refers to a force that is not directly brought about by an application of voltage to the structure being affected by the force. Conversely, a "passive force" generally encompasses any force that is produced and/or brought about by a release of stored energy from a first structure. However, some variations of this second aspect may have a first structure that is made up of a material that undergoes at least one physical characteristic in response to the application of voltage (e.g., a piezo-electric material). In such variations, a "passive force" may include applying voltage to the first structure to activate the material.

In the case of the second aspect, the exertion of the at least substantially upwardly-directed force may include using a pre-stressed beam. An example of a pre-stressed beam is a beam having an inherent stress gradient (like a compressed spring) such that release of one end of the beam causes the released end to flex and reposition the beam to a relaxed position. Accordingly, this exerting step may include bending a beam that is in contact with the elevator. This bending step may include using only passive forces, such as using only energy stored in the beam.

Since the at least substantially upwardly-directed force is generally exerted directly on the elevator in the case of the second aspect, the exerting step may be generally executed on an underside of the elevator. The exerting step may include moving the elevator to a neutral position. Herein, a "neutral position" refers to a location of the elevator that results when substantially no motive force is transmitted via a tether to raise/lower the elevator while and/or after the elevator has reached the second position. Some variations of the subject second aspect may include moving the elevator from the neutral position to change an orientation of the microstructure relative to the substrate. In other words, raising (i.e., moving away from the substrate) or lowering (i.e., moving toward the substrate) at least a free end of the elevator may cause tilting, movement, and/or displacement of the microstructure.

In the case of the second aspect, the microstructure (e.g., in the case where the microstructure is a mirror) may be disposed in at least substantially parallel relation to a lateral extent of the substrate when in at least one of the first and second positions. By contrast, the microstructure may exhibit an angular orientation between 0 degrees and 10 degrees in relation to a lateral extent of the substrate when in the second position. While moving the microstructure from the first position to the second position may result in changes of the angular orientation of the microstructure with respect to the substrate, the moving step may include increasing a spacing between the microstructure and the substrate. In other words, the microstructure may be spaced from the substrate by a first distance when in the first position and by a second distance, greater than the first distance, when in the second position.

In some variations of the method of the second aspect, the exerting step may also include using a lifter. This lifter may be maintained in spaced relation to the elevator prior to initiating the exerting step. One possible way of maintaining the positioning of the lifter prior to the exerting step may include anchoring a portion of the lifter with at least one fuse. In other words, the lifter can be held in a fixed position with respect to the substrate prior to carrying out the exerting step of the method. Accordingly, the exerting step may include blowing each fuse and moving the lifter at least generally away from the substrate into contact with the elevator. Those various features discussed above in relation to the second aspect of the present invention may be incorporated into any of the other aspects of the present invention as well, and in any appropriate manner noted herein.

BRIEF DESCRIPTION OF THE DRAWINGS

FIG. 2C is a perspective view of the mirror assembly of FIG. 2A at a time subsequent to activating the fuses.

FIG. 2D is a side view of the mirror assembly of FIG. 2C.

DETAILED DESCRIPTION

Figure 1A:
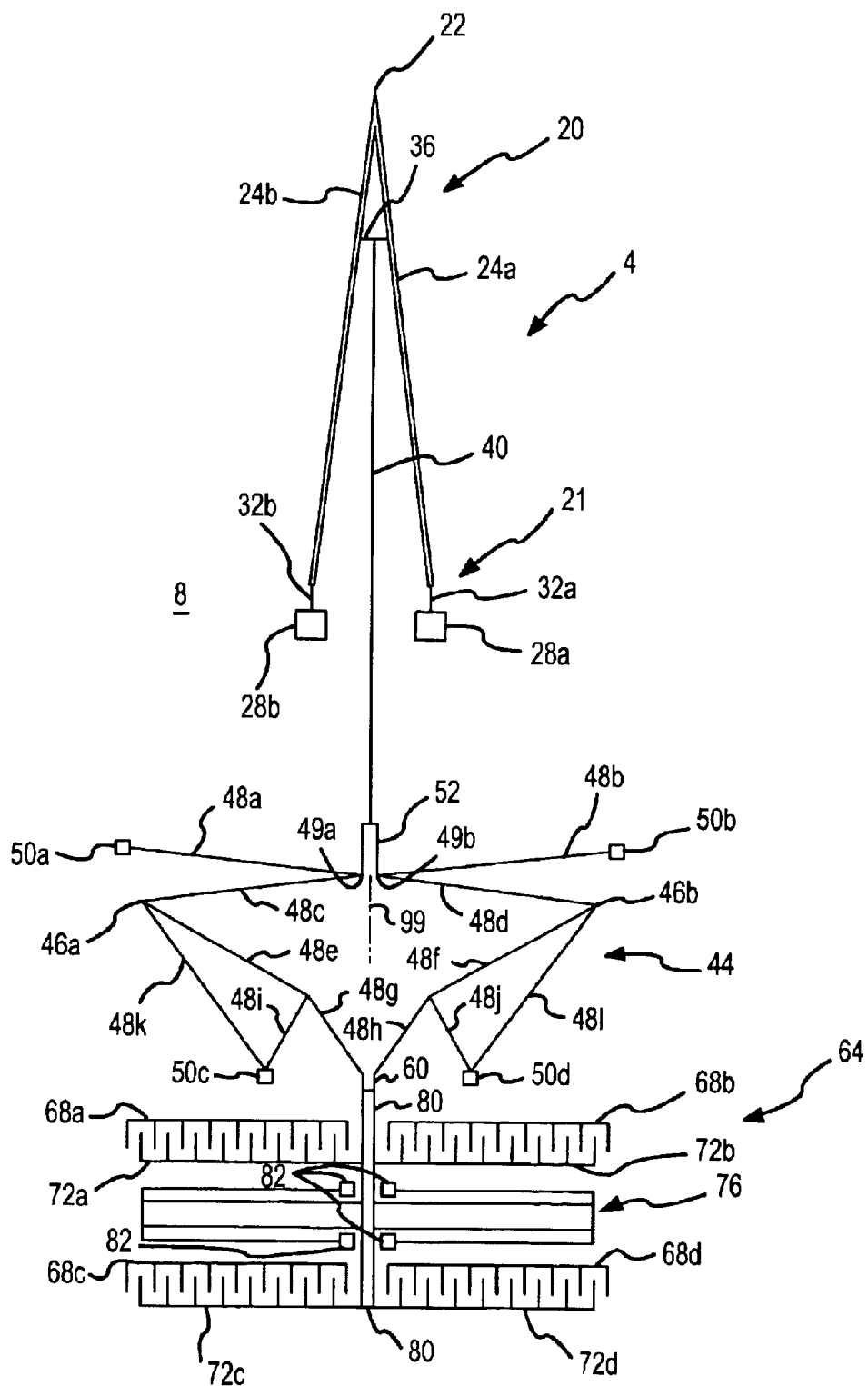
FIG. 1A is a plan view of one embodiment of a microelectromechanical system that includes a positioning assembly.

The present invention will now be described in relation to the accompanying drawings, which at least assist in illustrating its various pertinent features. Surface micromachining may be utilized to fabricate the various microstructures to be described herein. Various surface micromachined microstructures and the basic principles of surface micromachining are disclosed in U.S. Pat. No. 5,867,302, issued Feb. 2, 1999, and entitled "BISTABLE MICROELECTROMECHANICAL ACTUATOR"; and U.S. Pat. No. 6,082,208, issued Jul. 4, 2000, and entitled "METHOD FOR FABRICATING FIVE-LEVEL MICROELECTROMECHANICAL STRUCTURES AND MICROELECTROMECHANICAL TRANSMISSION FORMED", the entire disclosures of which are incorporated by reference in their entirety herein.

Surface micromachining generally entails depositing alternate layers of structural material and sacrificial material using an appropriate substrate which functions as the foundation for the resulting microstructure, which may include one or more individual microstructures. The term "substrate" as used herein means those types of structures that can be handled by the types of equipment and processes that are used to fabricate micro-devices on, within, and/or from the substrate using one or more micro photolithographic patterns. An exemplary material for the substrate is silicon. Various patterning operations (collectively encompassing the steps of masking, etching, and mask removal operations) may be executed on one or more of these layers before the next layer is deposited so as to define the desired microstructure. After the microstructure has been defined in this general manner, at least some of the various sacrificial layers are removed by exposing the microstructure and the various sacrificial layers to one or more etchants. This is commonly called "releasing" the microstructure from the substrate, typically to allow at least some degree of relative movement between the microstructure and the substrate. The term "sacrificial layer", therefore, means any layer or portion thereof of any surface micromachined microstructure that is used to fabricate the microstructure, but which does not exist in the final configuration. Exemplary materials for the sacrificial layers described herein include undoped silicon dioxide or silicon oxide, and doped silicon dioxide or silicon oxide ("doped" indicating that additional elemental materials are added to the film during or after deposition). Exemplary materials for the structural layers of the microstructure include doped or undoped polysilicon and doped or undoped silicon. The various layers described herein may be formed/deposited by techniques such as chemical vapor deposition (CVD) and including low-pressure CVD (LPCVD), atmospheric-pressure CVD (APCVD), and plasma-enhanced CVD (PECVD), thermal oxidation processes, and physical vapor deposition (PVD) and including evaporative PVD and sputtering PVD, as examples.

Only those portions of a microelectromechanical system that are relevant to the present invention will be described herein. The entirety of these various embodiments of microelectromechanical systems are defined by a plurality of microstructures, including structures that are on a "micro" scale or smaller). For convenience, the word "microstructure" may not be repeated in each instance in relation to each of these components. However, each such component is in fact a microstructure and "microstructure" is a structural limitation in the accompanying claims. Since the same (structurally and/or functionally) microstructure may be used in a variety of these embodiments, a brief discussion of the least some of these microstructures will be provided in an attempt to minimize repetitious description.

One or more microstructures of the various embodiments of microelectromechanical systems to be described herein move relative to other portions of the microelectromechanical system, and including a substrate that is used in the fabrication of the microelectromechanical system. Unless otherwise noted as being a key requirement for a particular embodiment, this relative movement may be achieved in any appropriate manner. Surface micromachining fabrication techniques allow for relative movement without having any rubbing or sliding contact between a movable microstructure and another microstructure or the substrate. All movement of a surface micromachined microstructure relative to the substrate is provided by a flexing or elastic deformation of one or more microstructures of the microelectromechanical system. Another option that may be utilized to allow a given microstructure to move relative to the substrate is to interconnect two or more microstructures together in a manner such that there is relative movement between these microstructures while the microstructures are in interfacing relation at least at some point in time during the relative movement (e.g., a hinge connection; a ball and socket connection).

At least one actuator may be utilized by the various embodiments of microelectromechanical systems to be described herein. Unless otherwise noted as being a key requirement for a particular embodiment, each of the following actuator characteristics or attributes will be applicable. Any appropriate type of actuator may be utilized. Appropriate types of actuators include without limitation electrostatic actuators, thermal actuators, piezoelectric actuators, magnetic actuators, and electromagnetic actuators. Moreover, any appropriate way of interconnecting an actuator with the substrate may be utilized. One actuator may be utilized to exert the desired force on a given microstructure, or multiple actuators may be interconnected in a manner to collectively exert the desired force on a given microstructure. The movement of an actuator may be active (via a control signal or a change in a control signal), passive (by a stored spring force or the like), or a combination thereof.

One or more of the various embodiments of microelectromechanical systems to be described herein utilize what may be characterized as an elongate coupling or tether to interconnect two or more microstructures. Unless otherwise noted as being a key requirement for a particular embodiment, any appropriate configuration may be used for any such tether. In at least certain applications, it may be desirable to have this tether be "stiff." A "stiff tether" means that such a tether is sufficiently stiff so as to not buckle, flex, or bow to any significant degree when exposed to external forces typically encountered during normal operation of the microelectromechanical system. As such, no significant elastic energy is stored in the tether, the release of which could adversely affect one or more aspects of the operation of the microelectromechanical system.

One or more of the various embodiments of microelectromechanical systems to be described herein may use an elevator or the like. This elevator is interconnected with the substrate in a manner such that at least part of the elevator is able to move at least generally away from or toward the substrate. Whether at least part of the elevator moves at least generally away from or at least generally toward the substrate is dependent upon the direction of the resulting force that is acting on the elevator. Unless otherwise noted as being a key requirement for a particular embodiment, each of the following elevator characteristics will be applicable. Any way of interconnecting the elevator with the substrate that allows for the desired relative movement between the elevator and the substrate may be utilized. Any configuration may be used for the elevator that allows for the desired relative movement between the elevator and the substrate may be utilized (single or multiple beam structures of any appropriate configuration). The desired movement of the elevator relative to the substrate may be along any path (e.g., along an arcuate path) and in any orientation relative to the substrate (e.g., along a path that is normal to the substrate; along a path that is at an angle other than 90° relative to the substrate).

One or more of the various embodiments of microelectromechanical systems to be described herein may use what is characterized as a displacement multiplier. A displacement multiplier is one type of pivotless compliant structure as noted above. Unless otherwise noted as being a key requirement for a particular embodiment, each of the following characteristics for a displacement multiplier will be applicable. Any layout of interconnected beams may be used to define the displacement multiplier, each of these beams may be of any appropriate configuration, and the displacement multiplier may be anchored to the substrate using any appropriate number of anchor locations and anchor location positionings. The input and output structures of the displacement multiplier may be of any appropriate configuration, and further may be disposed in any appropriate orientation relative to each other. The displacement multiplier may be configured to achieve any type/amount of motion of its input structure relative to its output structure. For instance, the input and output structures of the displacement multiplier may move the same or different amounts in the lateral dimension, and along any appropriate path. Although the displacement multiplier may be symmetrically disposed relative to a reference axis, such need not be the case. Displacement multipliers are described in U.S. Pat. No. 6,174,179 to Kota et al. and issued on Jan. 16, 2001, the entire disclosure of which is incorporated by reference herein.

One embodiment of a positioning assembly 4 for a microelectromechanical system is illustrated in FIG. 1A. The positioning assembly 4 includes an actuator 64. Typically the actuator 64 will move in two different directions to either move the elevator 20 at least generally away from the substrate 8 or to move the elevator 20 at least generally toward the substrate 8. The actuator 64 is of the electrostatic type and includes several stationary electrodes 68a–d that are fixed to the substrate 8 and several moveable electrodes 72a–d that are attached to a moveable frame or output bar 80. The output bar 80 is supported above the substrate 8 by a folded support spring assembly 76 that is anchored to the substrate 8 at four anchor points 82 to permit lateral movement of the output bar 80 relative to the substrate 8. "Lateral" or the like as used herein means at least generally parallel with an upper surface or the general extent of the substrate 8 (for instance, "horizontal"). Upon application of a control voltage via electrical interconnects (not shown) across the electrodes 68a–d, 72a–d, the moveable electrodes 72a–d are pulled laterally towards the stationary electrodes 68a–d, thereby moving the output bar 80 laterally in one direction. The amount of lateral movement corresponds with the magnitude of the actuation voltage applied. When there is a reduction in the actuation voltage, the actuator 64 moves in the opposite direction utilizing at least the spring force that was originally stored in the support spring assembly 76 (i.e., forces from one or more other sources may contribute to this movement of the actuator 64).

The output bar 80 of the actuator 64 is appropriately coupled to a displacement multiplier 44. The displacement multiplier 44 includes a plurality of interconnected beams 48a–1 and is interconnected with the substrate 8 at four anchors locations 50a–d so as to pivot about these anchor locations 50a–d by a flexure of various of the beams 48

(typically those beams 48 that are directly attached to an anchor 50). An input structure or first coupling 60 of the displacement multiplier 44 is appropriately interconnected with the actuator 64 (more specifically the output bar 80), while an output structure or second coupling 52 of the displacement multiplier 44 is appropriately interconnected with an elongate tether or coupling 40. The first coupling 60 and the second coupling 52 of the displacement multiplier 44 are longitudinally spaced relative to a central, longitudinal reference axis 99 along which the displacement multiplier 44 at least generally extends. Moreover, the first coupling 60 and the second coupling 52 are disposed along this axis 99 as well.

Lateral movement of the movable electrodes 72a–d of the actuator 64 exerts an input force on the displacement multiplier 44 at the first coupling 60 to cause at least a lateral movement thereof (and which may also cause the first coupling 60 to flex as well), which in turn causes the various beams 48 of the displacement multiplier 44 to pivot relative to the substrate 8 about the four anchor locations 50 at least generally within the lateral dimension and/or relative to other beams 48, which in turn moves the second coupling 52 of the displacement multiplier 44 in the lateral dimension. In the illustrated embodiment, the amount of lateral movement of the second coupling 52 of the displacement multiplier 44 is greater than the amount of lateral movement of the first coupling 60 of the displacement multiplier 44 (e.g., amplification) for any given amount of lateral movement of the actuator 64.

The elevator 20 has a base 21 that is movably interconnected with the substrate 8, as well as a free end or apex 22 that is movable at least generally away from and towards the substrate 8. The elevator 20 is in the form of an A-frame in the illustrated embodiment and is effectively a lever arm of sorts. More specifically, the elevator 20 is defined by a pair of elevation members 24a–b. One end of each elevation member 24 is interconnected with the substrate 8 by an anchor 28 and an interconnect 32 that is more pliable or flexible (or stated another way, less rigid) than its corresponding elevation member 24. The interconnects 32 may then be characterized as a compliant member, flexure, or the like. The "pivotally" connected end of the elevator 20 is the base 21. The opposite end of the elevator 20, namely the apex 22, is free to move at least generally away from/toward the substrate 8. That is, the apex 22 of the elevator 20 is not directly attached to the substrate 8 and is thereby able to move at least generally away from/toward the substrate 8 by a pivoting action at least generally about an axis that extends through the anchors 28a–b at the base 21 of the elevator 20 to provide the desired positioning function for the assembly 4. In the illustrated embodiment, the tether 40 is interconnected with a beam 36 that extends between and structurally interconnects the pair of elevation members 24. The beam 36 may be disposed anywhere between the base 21 and the apex 22 of the elevator 20. In fact, any way of interconnecting the tether 40 with the elevator 20 may be utilized.

Figure 1B:
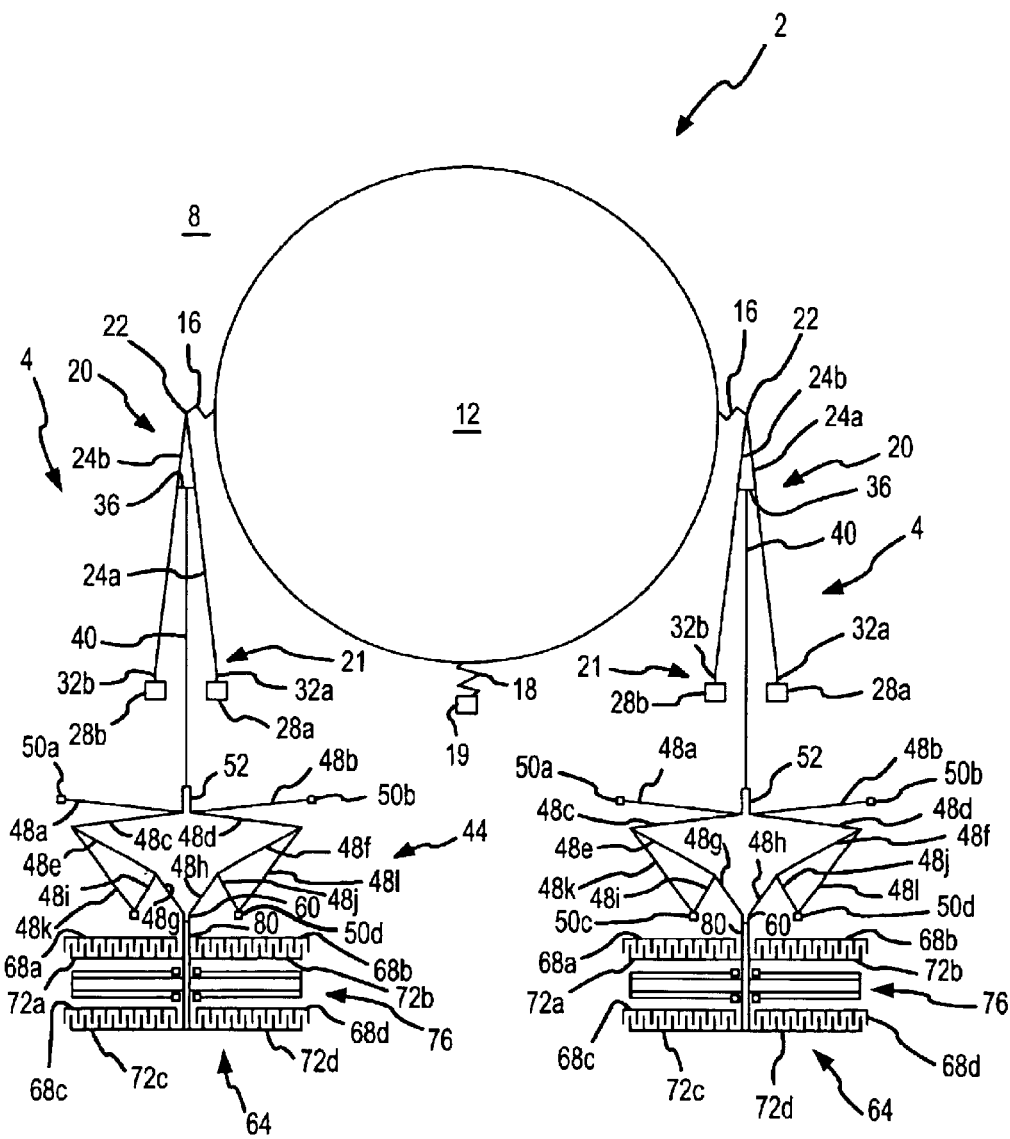
FIG. 1B is a plan view of a mirror assembly that utilizes a pair of the positioning assemblies illustrated in FIG. 1A.

One embodiment of a mirror assembly 2 that utilizes the above-described positioning assembly 4 is illustrated in FIG. 1B. The mirror assembly 2 includes a pair of positioning assemblies 4 for moving a mirror 12 at least generally away from/toward the substrate 8. Any appropriate number of positioning assemblies 4 may be utilized to achieve a desired movement of the mirror 12 relative to the substrate 8 (including using only a single positioning assembly 4 or multiple positioning assemblies 4), and any appropriate way of interconnecting the positioning assemblies 4 with the mirror 12 may be utilized as well so long as the point of interconnection is spaced from the base 21 of the elevator 20 (or stated another way such that the point of interconnection is at a location on the elevator 20 that is able to move at least generally away from/toward the substrate 8 during a lateral movement of the corresponding actuator 64 so as to move the mirror 12 at least generally away from/toward the substrate 8). In the illustrated embodiment, each elevator 20 is interconnected with the mirror 12 by a mirror interconnect 16. Any appropriate way of moving the mirror 12 relative to the substrate 8 may be utilized. In the illustrated embodiment, the mirror 12 is also pivotally connected with the substrate 8 by a mirror interconnect 18 at an anchor location 19. Other ways of pivotally interconnecting the mirror 12 with the substrate 8 could be utilized to achieve a different type of motion of the mirror 12 relative to the substrate 8. Moreover, the entirety of the interconnection of the mirror 12 with the substrate 8 may be provided through the positioning assembly(ies) 4.

Summarizing the operation of the mirror assembly 2, because each elevator 20 is anchored to the substrate 8 at its base 21, when the associated tether 40 is moved laterally by a lateral movement of the associated actuator 64 in one direction and a resultant lateral movement of both the first and second couplings 60, 52 of the associated displacement multiplier 44, the apex 22 of the associated elevator 20 is pivoted at least generally away from the substrate 8 at least generally through an arc to apply an at least generally upwardly-directed force to the mirror 12 at a location where the mirror 12 is attached to each such elevator 20. In essence, the elevators 20 act as lever arms to lift the mirror 12 (or at least a portion thereof) at least generally away from the substrate 8. Similarly, when the associated tether 40 is moved laterally by a lateral movement of the associated actuator 64 in a different direction (e.g., opposite to the first noted instance) and a resultant lateral movement of both the first and second couplings 60, 52 of the associated displacement multiplier 44, the apex 22 of the associated elevator 20 is pivoted at least generally toward the substrate 8 to apply an at least generally downwardly-directed force to the mirror 12 at a location where the mirror 12 is attached to the elevator 20. As such, increasing the length of the lever arms (elevators 20) increases the amount of vertical displacement of the mirror 12 relative to the substrate 8 for a given angular displacement of the lever arms. Since the mirror 12 is also pivotally interconnected with the substrate 8 by the mirror interconnect 18 at the anchor location 19, the mirror 12 also pivots relative to the substrate 8 as a result of any force applied to the mirror 12 by the pivoting elevators 20. Different types of relative movement between the mirror 12 and the substrate 8 may be realized by how/where each elevator 20 is interconnected with the mirror 12, how/where (including if at all) the mirror 12 is interconnected with the substrate 8, or both. Different types of movement of the mirror 12 relative to the substrate 8 also may be realized by the types of control signals provided to each of the actuators 64 and/or the direction of movement of each of the actuators 64. For instance equal or unequal control signals may be sent to the pair of actuators 64 associated with the pair of elevators 20 and will affect how the mirror 12 moves relative to the substrate 8. Moreover, one elevator 20 may be moved at least generally away from the substrate 8, while another elevator 20 may be moved at least generally toward the substrate 8.

FIGS. 2A–D illustrate a variation of the mirror assembly 2 presented in FIG. 1B, and as such, a "single prime" designation is used to identify the mirror assembly 2'. The mirror assembly 2' includes a positioning assembly 4' for moving the mirror 12' at least generally away from/toward the substrate 8. While only one positioning assembly 4' is illustrated, any appropriate number of positioning assemblies 4' may be utilized to achieve a desired movement of the mirror 12' relative to the substrate 8.

The positioning assembly 4' includes an elevator 20' that has a base 21 that is movably interconnected with the substrate 8, as well as a free end or apex 22' that is capable of being moved at least generally away from and towards the substrate 8. The elevator 20' exhibits an A-frame design/configuration and generally functions as a lever arm of sorts. More specifically, the elevator 20' is defined by a pair of elevation members 24a'–b'. One end of each elevation member 24' is interconnected with the substrate 8 by an anchor 28 and an interconnect 32 that is more pliable or flexible (or stated another way, less rigid) than its corresponding elevation member 24'. Each of the interconnects 32 may then be characterized as a compliant member, flexure, or the like. Accordingly, the "pivotally" connected end of the elevator 20' is the base 21. The apex 22' (generally being the end of the elevator 20' opposite the base 21) is free to move at least generally away from/toward the substrate 8. That is, the apex 22' of the elevator 20' is not directly anchored to the substrate 8 and is thereby able to move at least generally away from/toward the substrate 8 by a pivoting action at least generally about an axis that extends through the interconnects 32a–b at the base 21 of the elevator 20' to provide the desired positioning function for the lift assembly 4'. A plurality of crossbeams 36' extends between and structurally interconnects the pair of elevation members 24'. Each crossbeam 36' is generally anywhere between the base 21 and the apex 22' of the elevator 20'. In addition, these crossbeams 36' are positioned between the tether 40' and the substrate 8. Thus, besides structural support of the elevator 20', the crossbeams 36' may also ensure that portions of the tether 40' avoid getting situated between one of the elevation members 24' and the substrate 8 (which could potentially result in misalignment, bending, and/or breaking of the respective elevation member 24'). It should be noted that while the tether 40' is interconnected with the elevator 20' at the apex 22', a variety of other locations on the elevator 20' may be appropriate for interconnection with the tether 40' (e.g., a crossbeam 36').

The tether 40' of FIGS. 2A–2D generally interconnects the elevator 20' with an actuation assembly (e.g., 64) and/or a displacement multiplier (e.g., 44). As shown in FIG. 1A, the displacement multiplier (e.g., 44) may include an input structure (e.g., 60) and an output structure (e.g., 52). Thus, the actuator assembly (e.g., 64) may be interconnected with the input structure (e.g., 60), and the tether 40' may be interconnected with the output structure (e.g., 52). Thus, movement/actuation of one or more actuator elements (such as a moveable electrostatic comb) of the actuator assembly (e.g., 64) may be magnified by the displacement multiplier (e.g., 44) to provide a motive force to move/displace the tether 40', and accordingly, raise or lower the elevator 20'.

The positioning assembly 4' of FIGS. 2A–2D includes a substantially rigid engagement arm 26 that tends to be oriented in substantial alignment with a longitudinal extent of the tether 40'. This engagement arm 26 is illustrated as being an extension of both the tether 40' and the apex 22' of the elevator 20'. Other variations of the engagement arm 26 may be an at least semi-rigid (i.e., capable of resisting substantial bending when biased by another structure) extension of either of the tether 40' or the elevator 20', or it may be an at least semi-rigid and separate structure, which is appropriately interconnected with one or both of the tether 40' and the elevator 20' (preferably the apex 22').

In addition to the position assembly 4' having the engagement arm 26, the positioning assembly 4' also includes a first support arm 30. This first support arm 30 has an attachment portion 31 that laterally extends out from a base portion 34 of the engagement arm 26. The first support arm 30 also includes arcuately-shaped first and second support beams 38a, 38b, which extend out from the attachment portion 31 of the first support arm 30 in an at least generally perpendicular fashion. While these first and second support beams 38a, 38b are illustrated as being slightly arcuate, support beams 38 having other configurations like a straight configuration or a configuration more arcuately oriented (such as to conform to the outer radial curvature of the mirror 12') may also be utilized. As with the engagement arm 26, this first support arm 30 is illustrated as being an extension of both the tether 40' and the apex 22' of the elevator 20'. However, other variations of the support arm 30 may be extensions of either of the tether 40' or the elevator 20', or it may be a separate structure that is appropriately interconnected with one or both of the tether 40' and the elevator 20' (preferably the apex 22').

The lift assembly 4' is interconnected with the mirror 12' by first and second mirror interconnects 16a', 16b'. More specifically, the first and second support beams 38a, 38b of the first support arm 30 are interconnected with the mirror 12' via respective first and second mirror interconnects 16a', 16b'. Other appropriate ways of interconnecting the positioning assembly 4' with the mirror 12' may be utilized so long as the point of interconnection is spaced from the base 21 of the elevator 20'. That is, any appropriate way of interconnecting the positioning assembly 4' with the mirror 12' may be utilized so long as the point of interconnection is at a location on the elevator 20' or engagement arm 26 that is capable of moving at least generally away from/toward the substrate 8 (e.g., during a lateral movement of the corresponding actuator 64) so as to move the mirror 12 at least generally away from/toward the substrate 8.

The mirror assembly 2' includes a first elevator lifter 42 having a substantially stationary anchored end 54 interconnected with the substrate 8 via a first lifter anchor 56 and having a lifting end 58 positioned opposite the anchored end 54. This first elevator lifter 42 generally has an L-shaped configuration. In other words, the first elevator lifter 42 generally includes an elongate lifting beam 55 and a lifting arm 57, which is substantially perpendicularly oriented and directly connected to the lifting beam 55. The lifting beam 55 of the first elevator lifter 42 may be configured as a pre-stressed beam as will be discussed in more detail below (e.g., beams that have a propensity to flexion rather than extension). While the lifting arm 57 has a substantially perpendicular angular relationship to the lifting beam 55, other angular relationships may be utilized. Further, some variational embodiments may have a first elevator lifter 42 that exhibits one or both the lifting beam 55 and the lifting arm 57 having arcuate designs/configurations. The first elevator lifter 42 of the mirror assembly 2' is at least initially positioned in vertically spaced relation to the engagement arm 26. In other words, the first elevator lifter 42 is at least initially separated from and avoids contact with the engagement arm 26. However, some variational embodiments may exhibit a first elevator lifter that at least initially abuts (but does not exert any significant biasing force on) the engagement arm 26. As illustrated, the first elevator lifter 42 is generally positioned under at least a portion of the engagement arm 26 so that it is interposed between the substrate 8 and at least a portion of the engagement arm 26.

Figure 2A:
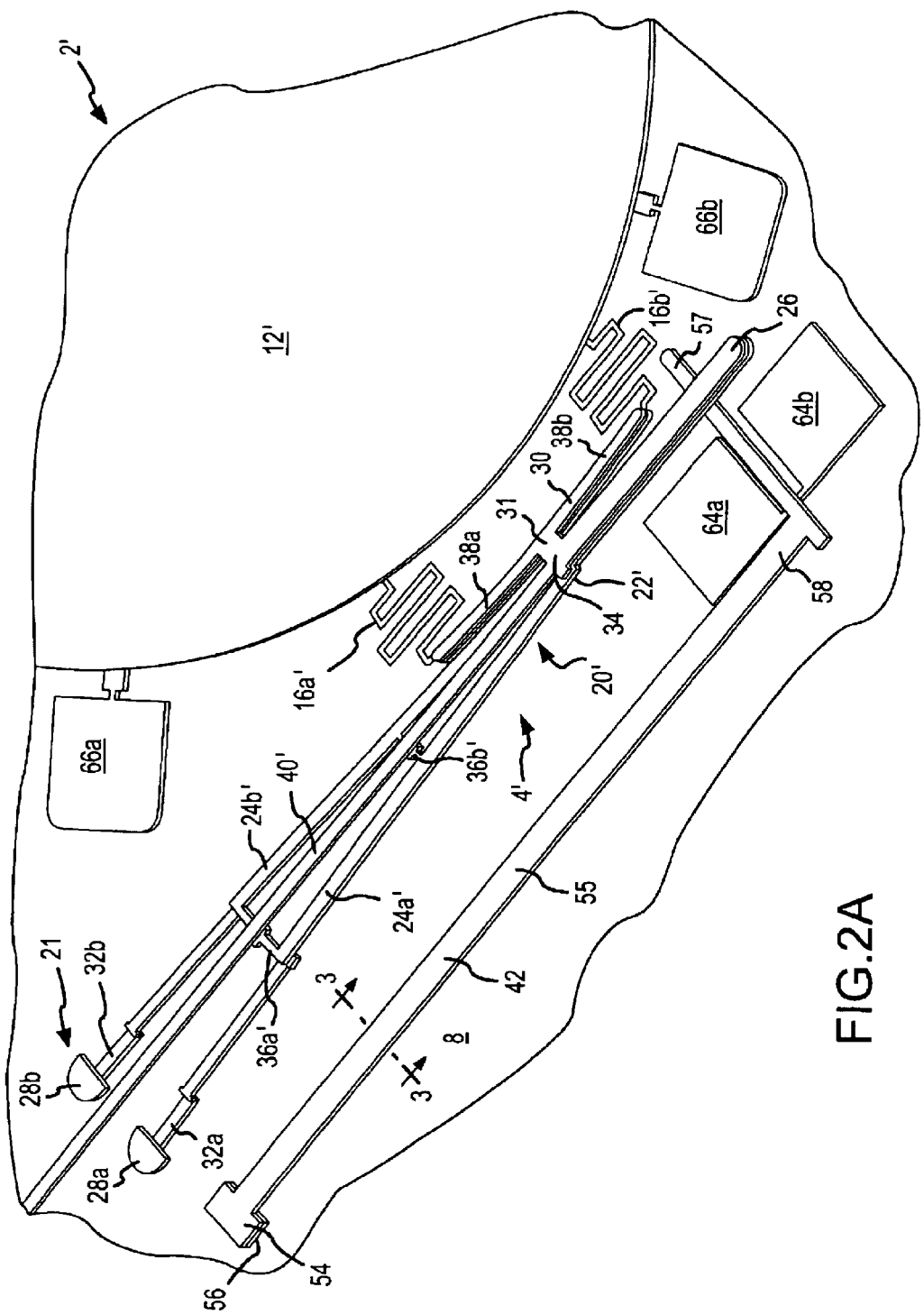
FIG. 2A is a perspective view of a mirror assembly at a time prior to activating attached fuses.

The mirror 12' of the mirror assembly 2' is illustrated in FIGS. 2A and 2C as being in first position at least generally defined by the mirror 12' being vertically spaced from the substrate 8 by a first distance 70. Thus, the mirror 12' is generally positioned above and avoids direct contact with the substrate 8. The mirror 12' is generally held in place by mirror fuses 66 to at least initially maintain the vertical positioning of the mirror 12' with respect to the substrate 8. Although only first and second mirror fuses 66a, 66b are illustrated, any appropriate number of fuses 66 may be utilized to at least temporarily hold the mirror 12' in the first position.

In addition, FIGS. 2A, 2C show that the first elevator lifter 42 is held in a pre-stressed condition due to the anchored end 54 being attached to the substrate 8 and the lifting end 58 being temporarily anchored to the substrate 8 by first and second lifter fuses 64a, 64b. In other words, the lifting beam 55 of this first elevator lifter 42 would be arcuately configured in a relaxed condition, but is stressed/extended in a substantially straight configuration in FIGS. 2A and 2C due to both ends 54, 58 being anchored to the substrate 8. Although lifting end 58 of the first elevator lifter 42 is illustrated as being held in a stressed/extended condition by two fuses 64, a single fuse or more than two fuses may be utilized to maintain the stressed/extended condition of the first elevator lifter 42. The lifter fuses 64 generally function to present the first elevator lifter 42 from effecting a biasing force on the engagement arm 26 of the elevator 20' before the fuses 64 are "blown".

Figure 2B:
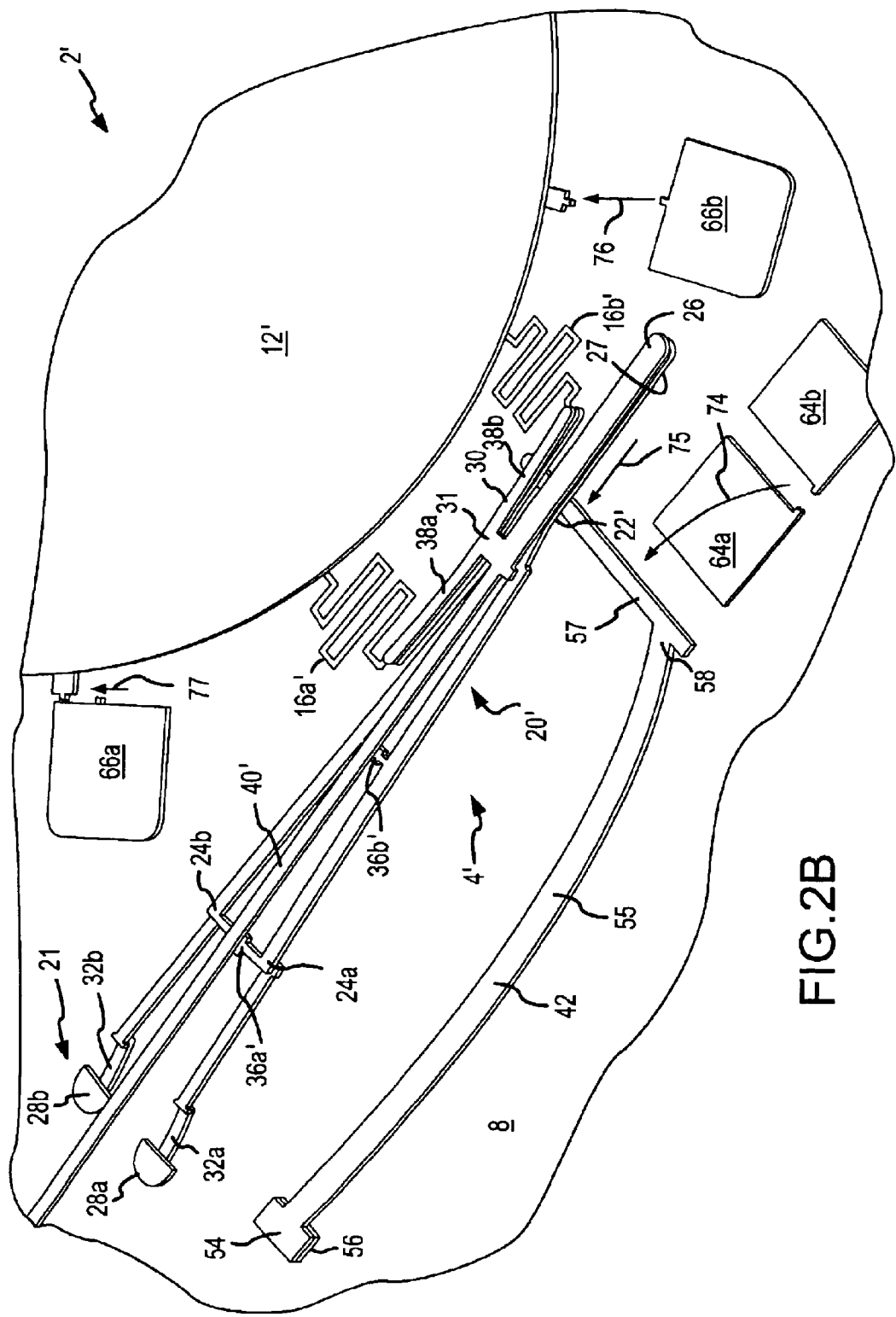
FIG. 2B is a side view of the mirror assembly of FIG. 2A.

In a transition from the first position of the mirror assembly 2' illustrated in FIGS. 2A and 2C to a second position of the mirror assembly 2' illustrated in FIGS. 2B and 2D, the fuses 64, 66 are "blown". Stated another way, a threshold voltage is applied to the fuses 64, 66 causing the fuses 64, 66 to break. Referring to FIGS. 2B and 2D, once the lifter fuses 64 break, the lifting beam 55 (preferably being a pre-stressed beam of sorts) of the first elevator lifter 42 generally flexes. Since the anchored end 54 of the first elevator lifter 42 is fixed to the substrate 8 by the first lifter anchor 56, the lifting end 58 of the first elevator lifter 42 moves in an at least generally upward direction (i.e., away from the substrate 8). As such, an at least substantially upwardly-directed force is exerted directly on the elevator 20' to move the apex 22' of the elevator 20' at least generally away from the substrate 8. This arcuate movement/flexion (indicated by arrow 74) of the lifting end 58 of the first elevator lifter 42 causes the lifting arm 57 to engage the engagement arm 26 of the elevator 20' to move the elevator 20' at least generally away from the substrate 8. This arcuate movement 74 not only causes the lifting arm 57 to engage the engagement arm 26, but also to slide along a lower surface 27 of the engagement arm 26 in the direction indicated by arrow 75. However, other variational embodiments may exhibit the lifting arm 57 interfacing with the lower surface 27 of the engagement arm 26 in other directions than the direction indicated by arrow 75 since this direction of interface may be dependant on (among other factors) relative lengths of one or more of the elevator 20' (and/or an associated engagement arm 26) and the elevator lifter 42. It is the exertion of the at least substantially upwardly-directed force that moves the mirror 12' from the first position illustrated in FIGS. 2A and 2C to the second position illustrated in FIGS. 2B and 2D. In other words, since the mirror 12' is interconnected with the elevator 20' (via the first support arm 30 and the interconnects 16), exertion of an upwardly-directed (i.e., oriented at least generally away from the substrate 8 in the direction of the arrow 74) force by the first elevator lifter 42 on the engagement arm 26 of the elevator 20' tends to cause the mirror 12' to move in the general direction indicated by arrows 76, 77. Since the mirror 12' is elevated/lifted to the second position illustrated in FIGS. 2B and 2D by another microstructure (i.e., first elevator lifter 42) biasing the elevator 20' rather than by a force brought about due to some inherent property/ characteristic of the elevator 20' itself, it may be said that the elevation/lifting of the mirror 12' is due to the exertion of a passive force on the elevator 20'.

It is the exertion of this upwardly directed force from the flexion of the first elevator lifter 42 that may be characterized as moving the elevator 20' to a neutral position. As previously mentioned, a "neutral position" generally refers to a location of the elevator 20' that results when substantially no motive force is transmitted via the tether 40' to raise/lower the elevator 20' while and/or after the elevator 20' has reached the second position shown in FIGS. 2B and 2D. From this neutral position, the elevator 20' may be raised and subsequently lowered back to the neutral position to alter an orientation of the mirror 12' relative to the substrate 8. In other words, once the fuses 64, 66 and blown and the mirror assembly 2' exhibits the second position, raising (i.e., moving away from the substrate) or lowering (i.e., moving toward the substrate) the elevator 20' will generally bring about tilting, movement, and/or displacement of the mirror 12'. However, it is important to note that the elevator 20' of FIGS. 2B and 2D generally cannot be lowered (i.e., the free end or apex 22' cannot get closer to the substrate 8) from this neutral position, although it can be raised and subsequently lowered back to the neutral position.

As illustrated in FIG. 2C, the mirror 12' may be generally disposed in an at least substantially parallel relation to a lateral extent of the substrate 8 when it is in the first position. By contrast, the mirror 12' may exhibit an angular orientation between 0 degrees and 10 degrees in relation to a lateral extent of the substrate 8 when in the second position illustrated in FIGS. 2B and 2D. However, the angular position of the mirror 12' in the noted second position is not of particular relevance in relation to the present invention defined by the following claims. While moving the mirror 12' from the first position to the second position may result in changes of the angular orientation of the mirror 12' with respect to the substrate 8, this moving step may also include increasing a spacing between the mirror 12' and the substrate 8. In other words, the mirror 12' is generally spaced from the substrate 8 by a first distance 70 when in the first position. However, at least a portion of the mirror 12' is generally spaced from the substrate 8 by a second distance 71 greater than the first distance 70 when in the second position shown in FIGS. 2B and 2D. Generally, the elevator lifter 42 contacting and biasing the elevator 20' causes this increased separation between the mirror 12' and the substrate.

Figure 3:
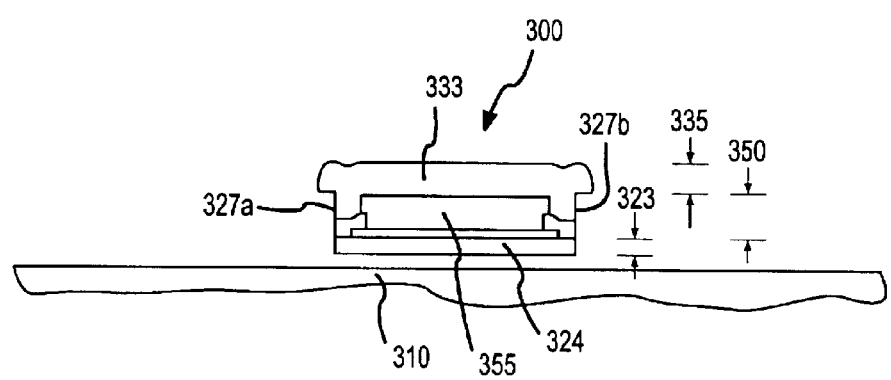
FIG. 3 is a cross-sectional view of a pre-stressed beam taken along cut-line 3—3 of FIG. 2A.

One configuration that may be utilized by the elevator lifter 42 is illustrated in FIG. 3 in the form of a pre-stressed beam 300. The pre-stressed beam 300 exhibits an upper wall 333 being disposed in a vertically spaced relation to a lower wall 324. Sidewalls 327 extend between and interconnect the upper and lower walls 333, 324. It is important to note that a first thickness 323 of the lower wall 324 is less than a second thickness 335 of the upper wall 333 of the pre-stressed beam 300 of FIG. 3. In other words, the upper wall 333 is thicker than the lower wall 324 of the pre-stressed beam 300. Generally, this first thickness 323 of the lower wall 324 may range from about 0.3 micron to about 1.5 microns, and is preferably about 1 micron. Similarly, the second thickness 335 of the upper wall 333 may range from about 1.5 microns to about 4 microns, and is preferably about 2 microns. In addition, a third thickness 350 of a core material 355 (generally an oxide) positioned between the upper and lower walls 324, 333 of the pre-stressed beam 300 may generally be within a range of about 0.3 micron to about 6 microns, and more preferably about 4 microns.

One way to fabricate the pre-stressed beam 300 of FIG. 3 is illustrated in FIGS. 4A–L which show schematic cross-sections of the pre-stressed beam 300 at various stages in the fabrication process. The surface micromachining processes are based on conventional IC processing steps, including material deposition, photolithography, masking, etching, mask stripping, and cleaning. Up to hundreds of individual process steps can be used to form the completed structure of the pre-stressed beam 300 based on repeated deposition and patterning of alternating layers of structural material (e.g., polysilicon) and sacrificial material (e.g., silicon dioxide or a silicate glass), with the pre-stressed beam 300 being built up layer by layer. In a preferred process for forming the pre-stressed beam 300, 3 layers or levels of polysilicon are used as described hereinafter (not including a Poly-0 layer which generally provides electrical interconnections between the pre-stressed beam 300 and/or other components of the mirror assembly 2'). The term "patterning" as used herein refers to a sequence of well-known processing steps including applying a photoresist to the substrate, prebaking the photoresist, aligning the substrate with a photomask, exposing the photoresist through the photomask, developing the photoresist, baking the wafer, etching away the surfaces not protected by the photoresist, and stripping the protected areas of the photoresist so that further processing can take place. The term "patterning" can further include the formation of a hard mask (e.g. comprising up to about 500 nanometers or more of a silicate glass deposited from the decomposition of tetraethylortho silicate (as known as TEOS) by low-pressure chemical vapor deposition at about 750° C. and densified by a high temperature processing) overlying a polysilicon or sacrificial material layer in preparation for defining features into the layer by etching.

Figure 4A:
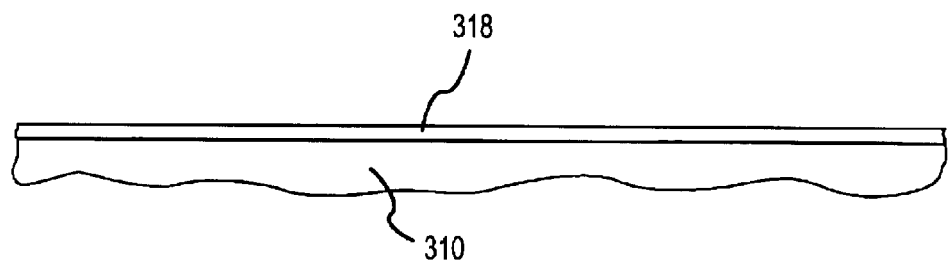
FIGS. 4A–L are sequential cross-sectional views of a method for making a pre-stressed beam.

In FIG. 4A, a substrate 310 is provided which preferably comprises silicon, and can be either a monocrystalline silicon substrate or a silicon-on-insulator substrate. A variety of processing steps can be performed to and/or on the substrate 310. In an optional step of the process, the substrate 310 can be initially pretreated for fabrication of the pre-stressed beam 300 by blanketing the substrate 310 with a layer of thermal oxide formed by a conventional wet oxidation process at an elevated temperature (not shown). In addition, a layer of low-stress silicon nitride (not shown) may be deposited over the thermal oxide layer. The silicon nitride layer (also referred to as a "dielectric layer") generally provides electrical isolation from the substrate 310. While it is understood that other layers may be deposited on the substrate 310, such as a base structural layer (also referred to as Poly-0), these layers will not be discussed into their lack of significance to the present invention. However, such layers should be understood to be included in the substrate 310.

Still referring to FIG. 4A, a first sacrificial layer 318 may be formed to cover the substrate 310. As mentioned previously, this first sacrificial layer 318 can be made from silicon dioxide ($SiO_2$), a silicate glass, or any other appropriate sacrificial material. In a preferred, yet optional step, after deposition, each sacrificial layer may be planarized by an appropriate planarizing process such as chemical-mechanical polishing, for example, if there is an undesired topography on the upper surface of the relevant sacrificial layer or if it is desired to reduce the thickness of the relevant sacrificial layer prior to depositing the next structural layer.

Figure 4B:
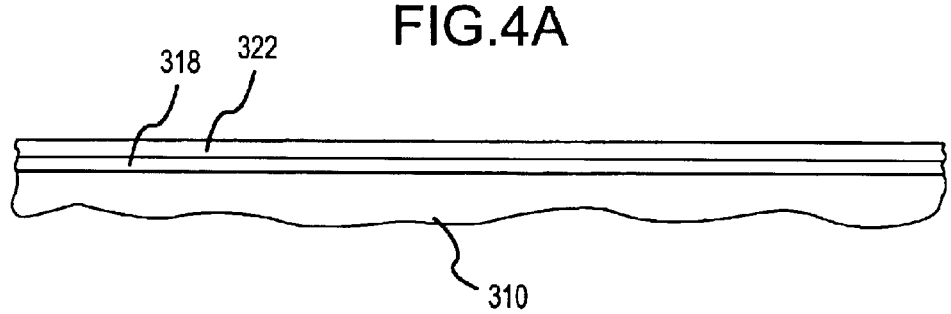
Figure 4C:
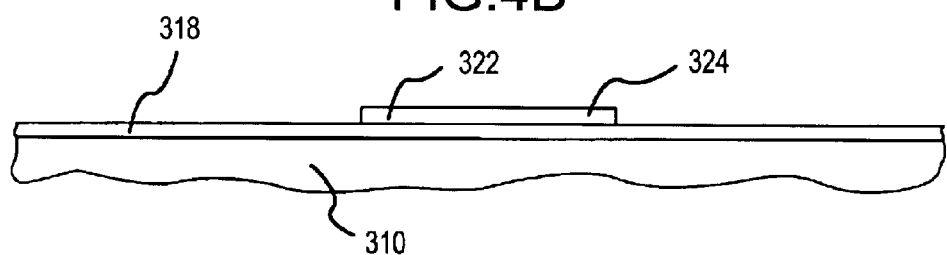
Figure 4D:
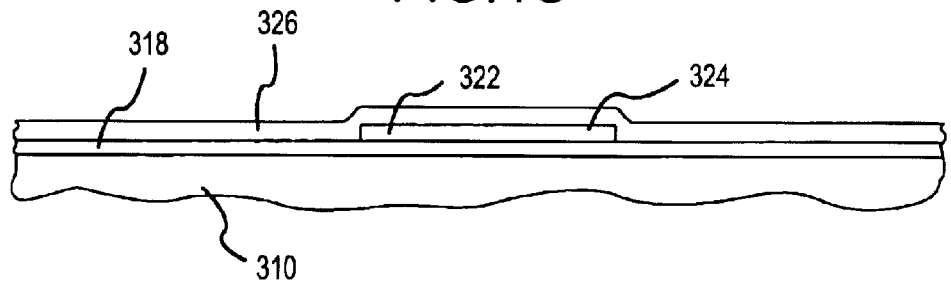
Figure 4E:
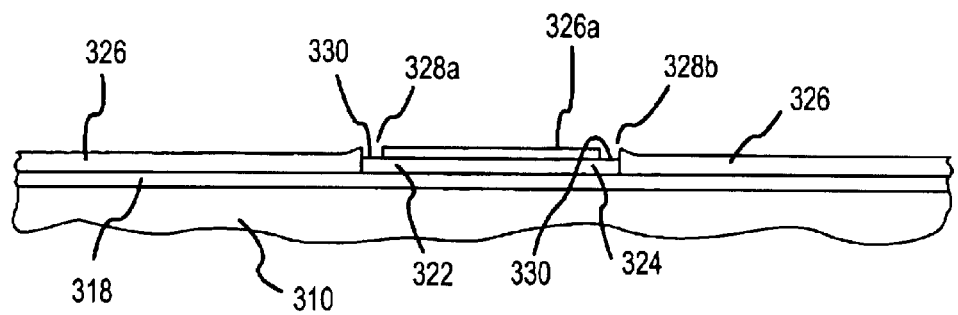
Figure 4F:
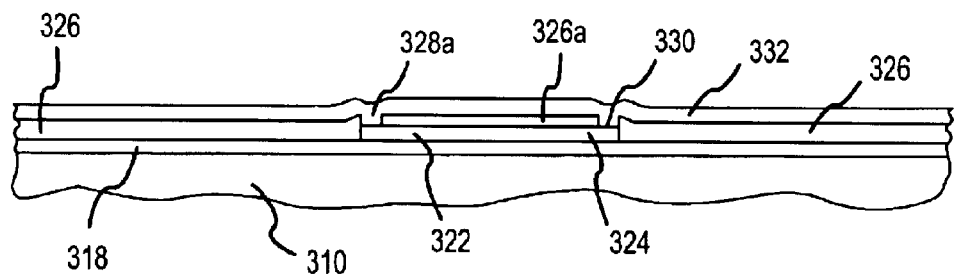
Figure 4G:
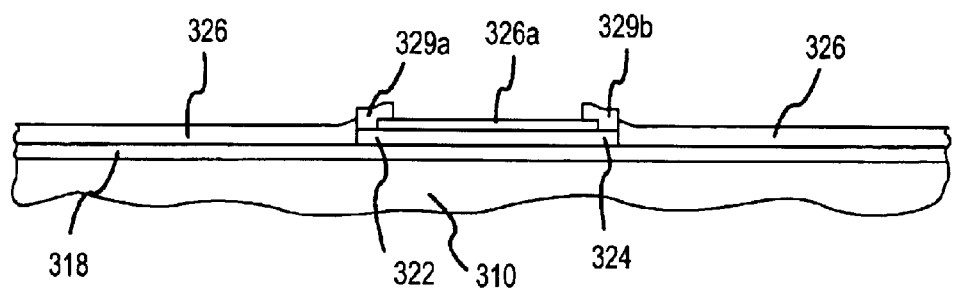

Referring to FIG. 4B, a first structural layer 322 (also referred to as Poly-1) having a first thickness 323 (FIG. 3) is formed atop the first sacrificial layer 318. The first structural layer 322 is then patterned, as shown in FIG. 4C to form a lower wall 324 of the pre-stressed beam 300 of FIG. 3. A second sacrificial layer 326, usually made up of the same sacrificial material as the first sacrificial layer 318, can then be formed over the lower wall 324 (patterned from the first structural layer 322) and the first sacrificial layer 318 as illustrated in FIG. 4D. Referring to FIG. 4E, the second sacrificial layer 326 is generally patterned to form a plurality of lower channels 328 corresponding to locations for future formation of the sidewalls 327 of the pre-stressed beam 300 shown in FIG. 3. Generally, a floor 330 of at least some of the plurality of lower channels 328 are patterned in such a manner as to be at least partially defined by the lower wall 324 formed from the first structural layer 322. Referring to FIG. 4F, a second structural layer 332 (also referred to as Poly-2) is formed over the second sacrificial layer 326 including the entireties of the floors 330 of the lower channels 328. This second structural layer 332 is then patterned (as shown in FIG. 4G) to form lower portions 329 of the sidewalls 327 shown in FIG. 3.

Figure 4H:
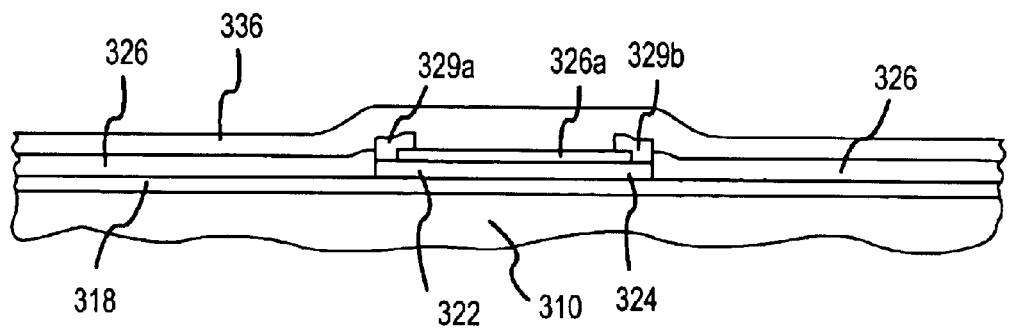
Figure 4I:
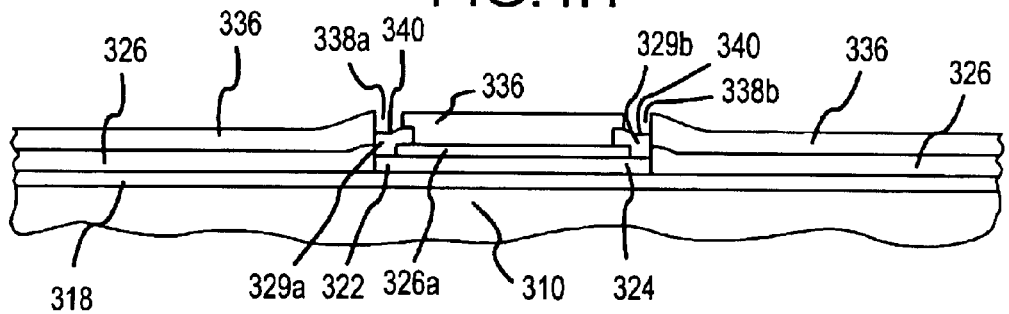

In FIG. 4H, a third sacrificial layer 336, usually made up of the same sacrificial material as one or both the first and second sacrificial layers 318, 326, is formed over the second sacrificial layer 326 and the remaining portions of the second structural layer 332 (e.g., lower portions 329 of the sidewalls 327). This third sacrificial layer 336 may also undergo an optional planarizing step. Referring to FIG. 4I, the third sacrificial layer 336 is generally patterned to form a plurality of receptacles 338 corresponding to locations for subsequent formation of upper portions 331 of the sidewalls 327. Generally, a floor 340 of each of these receptacles 338 is at least partially defined by the remaining portions of the second structural layer 332 (e.g., lower portions 329 of the sidewalls 327).

Figure 4J:
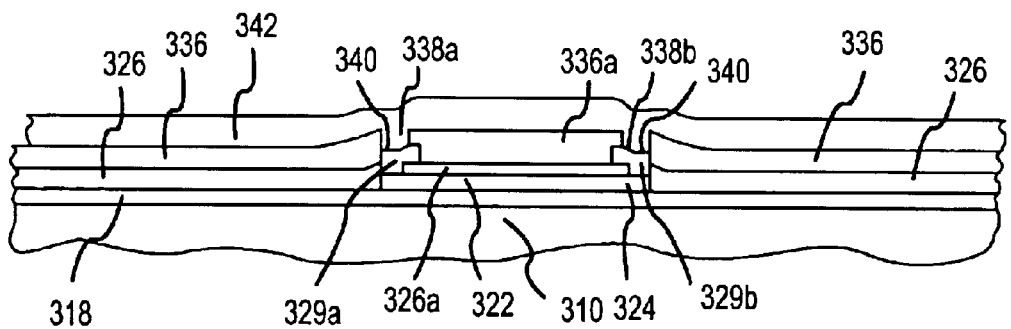
Figure 4K:
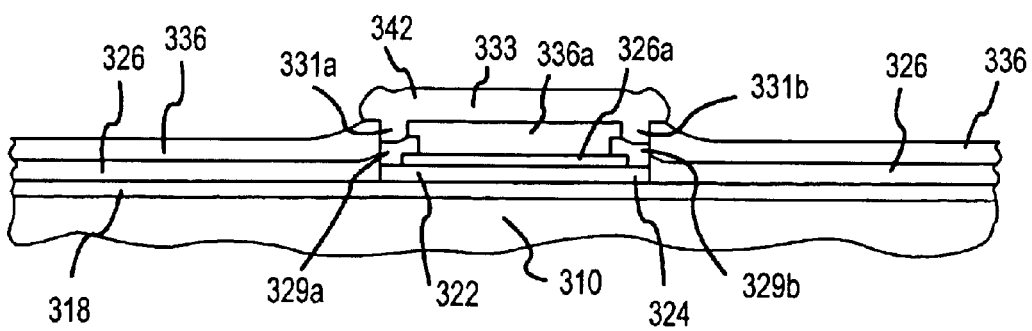
Figure 4L:
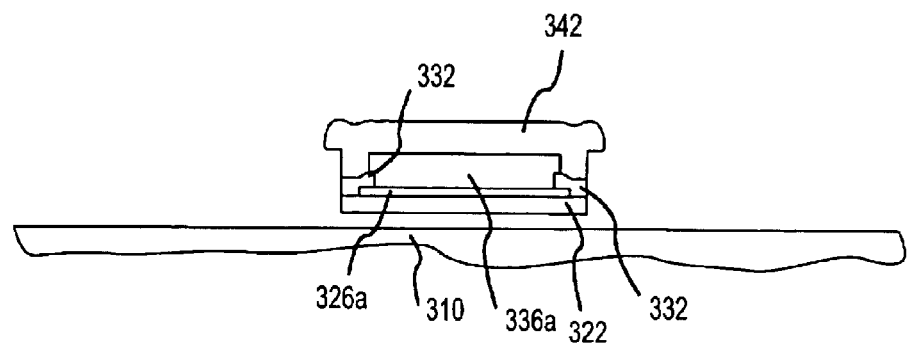

Referring to FIG. 4J, a third structural layer 342 (also referred to as Poly-3) is formed over the third sacrificial layer 336 including the entireties of the floors 340 of the receptacles 338. In other words, the structural material that makes up the third structural layer substantially occupies the entireties of the receptacles 338. This third structural layer 342 is then patterned to form the upper portions 331 of the sidewalls 327 disposed atop the lower portions 329 shown in FIG. 3, as well as an upper wall 333 thus encapsulating portions 326a, 336a of second and third sacrificial layers 326, 336, respectively. FIG. 4K illustrates the patterning of the third structural layer 342 by the formation of the upper portions 331 of the sidewalls 327 disposed atop the lower portions 329, as well as an upper wall 333 shown in FIG. 3. FIG. 4L illustrates that the structure is then released for operation by selectively etching away exposed portions of the various sacrificial layers (e.g., 318, 326, 336) using an appropriate etchant that does not substantially affect the structural integrity of the various structural layers (e.g., 322, 332, 342). While FIGS. 3 and 4A–L illustrate the various features as defined layers, it will be understood that the various layers of sacrificial material may generally be undetectable (e.g., layers 318, 326, 336 may appear as one layer of sacrificial material). Similarly, while FIGS. 3 and 4A–L illustrate the various features as defined layers, it will be understood that the various layers of structural material may generally be undetectable (e.g., layers 322, 332, 342 may appear as one continuous assembly of structural material).

Figure 5A:
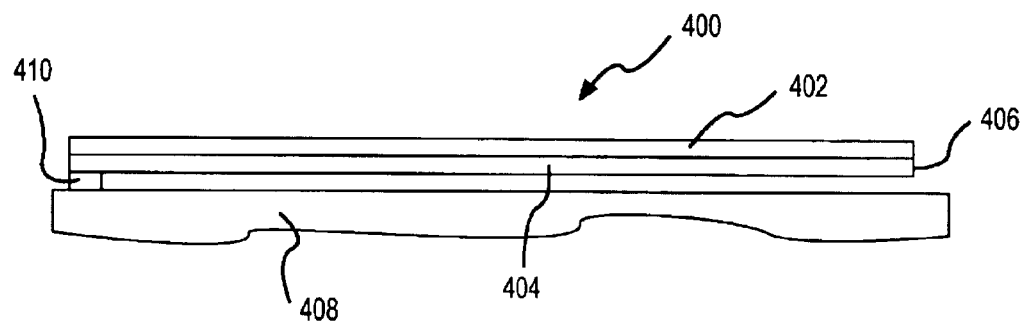
FIG. 5A is a side view of one embodiment of a pre-stressed beam that may be utilized by the mirror assembly of FIGS. 2A–D.
Figure 5B:
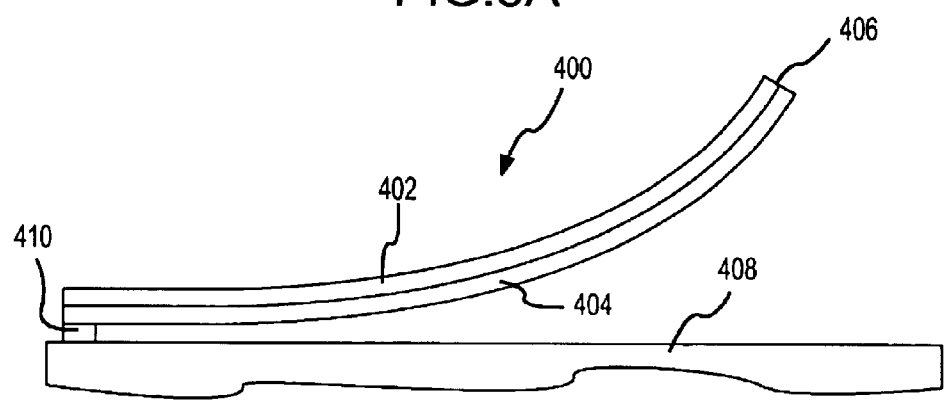
FIG. 5B is a side view of the pre-stressed beam of FIG. 5A after a free end of the beam has been released.

Another configuration of a pre-stressed beam 400 that may be appropriate for the elevator lifter 42 is illustrated in FIGS. 5A and 5B. The pre-stressed beam 400 includes an upper layer 402 and a lower layer 404. In some embodiments of the beam 400, the upper layer 402 may be made up of a structural material such as doped/undoped silicon/polysilicon (or the like), and the lower layer 404 may be made up of a sacrificial material such as doped/undoped silicon oxide/dioxide (or the like). Some embodiments of this pre-stressed beam 400 may only vary from the pre-stressed beam 300 of FIG. 3 in that the pre-stressed beam 400 may be substantially devoid of a lower wall 324 and sidewall 327. The benefit of utilizing a sidewall 327 and a lower wall 324 (as shown in the pre-stressed beam 300 of FIG. 3) is that they tend to protect the core 355 (which may be made of sacrificial material such as an appropriate oxide) from being etched away during a releasing step of a fabrication process (e.g., such as the release step associated with FIG. 4L). In other embodiments of the pre-stressed beam 400 of FIGS. 5A and 5B, the upper layer 402 may be made up of an appropriate nitride (e.g. silicon nitride) or an appropriate metal (e.g., gold), while the lower layer 404 may be made up of structural material.

Movement of the pre-stressed beam 400 from a first position illustrated in FIG. 5A to a second position illustrated in FIG. 5B is due to an inherent stress gradient that exists within the pre-stressed beam 400 as a result of the upper layer 402 having a greater stress gradient component than the lower layer 404. The inherent stress gradient of the beam 400 bends the free end 406 of the pre-stressed beam 400 away from the substrate 408 and at least generally about the anchor 410 to accommodate the stress gradient. The pre-stressed beam 400 thereby in effect forms a compressed spring which may exert an at least generally upwardly-directed force on any structure interconnected or interfacing therewith to at least attempt to move the same away from the substrate 408.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed is:

1. A method for controlling a position of a mirror relative to a substrate, comprising the steps of:

exerting an at least substantially upwardly-directed force directly on an elevator to move at least a portion of said elevator at least generally away from said substrate, wherein said mirror is interconnected with said at least a portion of said elevator; and moving said mirror from a first position to a second position by said exerting step.

2. A method, as claimed in claim 1, wherein:
said exerting step comprises using a pre-stressed beam.
3. A method, as claimed in claim 1, wherein:
said exerting step comprises exerting a passive force on said elevator.
4. A method, as claimed in claim 1, wherein:
said exerting step comprises bending a beam that is in contact with said elevator.
5. A method, as claimed in claim 4, wherein:
said bending step comprises using only passive forces.
6. A method, as claimed in claim 4, wherein:
said bending step comprises using only energy stored in said beam.
7. A method, as claimed in claim 1, wherein:
said exerting step is executed on an underside of said elevator.
8. A method, as claimed in claim 1, wherein:
said exerting step comprises moving said elevator to a neutral position.
9. A method, as claimed in claim 8, further comprising the step of:

moving said elevator from said neutral position to change an orientation of said mirror relative to said substrate.

10. A method, as claimed in claim 1, wherein:
said mirror is disposed in at least substantially parallel relation to a lateral extent of said substrate when in at least one of said first and second positions.
11. A method, as claimed in claim 1, wherein:
said mirror is disposed at an angular orientation between 0 degrees and 10 degrees in relation to a lateral extent of said substrate when in said second position.
12. A method, as claimed in claim 1, wherein:
said moving step comprises increasing a spacing between said mirror and said substrate.
13. A method, as claimed in claim 1, wherein:
said moving step comprises changing an angular orientation of said mirror relative to said substrate.
14. A method, as claimed in claim 1, wherein:
said exerting step comprises using a lifter, wherein said method further comprises the step of maintaining said lifter in spaced relation to said elevator prior to initiating said exerting step.
15. A method, as claimed in claim 14, wherein:
said maintaining step comprises anchoring a portion of said lifter with at least one fuse, and wherein said exerting step comprises blowing each said fuse and moving said lifter at least generally away from said substrate into contact with said elevator.

* * * * *